United States Patent
Hirai et al.

(10) Patent No.: US 8,957,640 B2
(45) Date of Patent: Feb. 17, 2015

(54) METHOD FOR ACCURATELY AND PRECISELY CALCULATING STATE OF CHARGE OF A SODIUM-SULFUR BATTERY

(75) Inventors: Naoki Hirai, Nagoya (JP); Motohiro Fukuhara, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 764 days.

(21) Appl. No.: 13/222,009

(22) Filed: Aug. 31, 2011

(65) Prior Publication Data
US 2011/0313699 A1    Dec. 22, 2011

Related U.S. Application Data

(63) Continuation of application No. PCT/JP2010/052203, filed on Feb. 15, 2010.

(30) Foreign Application Priority Data

Mar. 25, 2009   (JP) .................................. 2009-073877

(51) Int. Cl.
     *H02J 7/00*            (2006.01)
     *G01R 31/36*          (2006.01)
     *H01M 10/39*         (2006.01)

(52) U.S. Cl.
     CPC ........ *G01R 31/3665* (2013.01); *G01R 31/3606* (2013.01); *H01M 10/3909* (2013.01); *G01R 31/3658* (2013.01)
     USPC .......................................... 320/149; 320/132

(58) Field of Classification Search
     USPC ....................................................... 320/149
     See application file for complete search history.

(56) References Cited

U.S. PATENT DOCUMENTS

| | | | | |
|---|---|---|---|---|
| 8,574,741 B2 * | 11/2013 | Sato | ............................... | 429/121 |
| 8,723,359 B2 * | 5/2014 | Fukuhara | ........................ | 307/51 |
| 2001/0048286 A1 * | 12/2001 | Tanaka et al. | ................. | 320/116 |
| 2003/0117143 A1 | 6/2003 | Okada | | |
| 2009/0243555 A1 * | 10/2009 | Tominaga | ...................... | 320/162 |

FOREIGN PATENT DOCUMENTS

| | | |
|---|---|---|
| CN | 1428888 A | 7/2003 |
| JP | 03-158781 A1 | 7/1991 |
| JP | 08-017478 A1 | 1/1996 |
| JP | 09-318716 A1 | 12/1997 |
| JP | 2008-251291 A1 | 10/2008 |

OTHER PUBLICATIONS

Chinese Office Action dated Mar. 4, 2013.

* cited by examiner

*Primary Examiner* — Arun Williams
(74) *Attorney, Agent, or Firm* — Burr & Brown, PLLC

(57) ABSTRACT

An accurately and precisely calculation of the state of charge of a sodium-sulfur battery may be made by determining a state of charge Qr according to expression (1) given below even if the sodium-sulfur battery is applied to compensate for fluctuations in the power generated by a natural energy generating device: $Qr=100\times(1-(Qu/(Qa-Qsf)))$ ... (1) where Qu: used capacity; Qa: product capacity; and Qsf: residual capacity in final year; and $Qsf=f1(Cef)$ ... (2) where f1(Cef): conversion function for determining the residual capacity Qsf in the final year on the basis of the equivalent cycle Cef in final year.

4 Claims, 4 Drawing Sheets

METHOD FOR ACCURATELY AND PRECISELY CALCULATING STATE OF CHARGE OF A SODIUM-SULFUR BATTERY

TECHNICAL FIELD

The present invention relates to a method for accurately calculating the state of charge of a sodium-sulfur battery.

BACKGROUND ART

A sodium-sulfur battery may be given as one example of electric power storage devices which are expected to be used more and more in various application fields, such as electric-load leveling, measures against a momentary drop in power, or compensation for fluctuations in the power generated by a natural energy generating system.

Such a sodium-sulfur battery is generally configured in such a manner that a plurality of electric cells is connected in series to form a string, a plurality of thus connected strings is connected in parallel to form a block, a plurality of thus connected blocks is connected in series to form a module, and finally a plurality of thus connected modules is connected in series. And, the operating cycle of the sodium-sulfur battery, in case of the application of the load leveling, for example, is a repetition of a cycle consisting of a discharge and a charge with an intervening idle period there between.

Failure of the sodium-sulfur battery to exhibit its expected performance would interfere with the aforesaid applications, such as the load leveling, measures against a momentary drop in power, and the compensation for fluctuations in power. Further, if the sodium-sulfur battery repeats charges and discharges, deviating from its set operational range, then the battery will be overdischarged or overcharged, leading to reduction in the performance thereof. It is important, therefore, to accurately grasp the state of charge of the sodium-sulfur battery.

As one of the conventional methods for calculating the state of charge of a sodium-sulfur battery, there has been known, for example, a method for calculating the state of charge by integrating the charge currents or the discharge currents of the sodium-sulfur battery and then calculating the state of charge on the basis of the integrated value and a rated capacity thereof. More specifically, the integrating value of the discharge currents may be subtracted from the rated capacity at the time of a discharge, while the integrated value of the charge currents may be added to the state of charge (before the charge) to calculate a (an updated) state of charge at the time of a charge. JP-A-08-017478 may be given as an example of a prior art.

SUMMARY OF THE INVENTION

However, if an error in the measurement of the charge current or the discharge current would occur, the error should be expanded to a great extent by the integration, and this would make it difficult to accurately calculate the state of charge.

Further, if the rated capacity of the sodium-sulfur battery decreases due to the increase in the residual capacity by the deterioration or the like of electric cells, this would generate an error between the state of charge calculated by the integration and the actual state of charge, and would make it impossible to accurately calculate a true state of charge. The failure to accurately calculate the true state of charge is apt to operate the sodium-sulfur battery, with deviating from its operational range. This may lead to an overdischarge or an overcharge, eventually causing a vicious circle of further deterioration or the like of the electric cells.

In many cases, however, the product capacity (absolute charge) of a sodium-sulfur battery is provided with an electrical tolerance so as to restrain a drop in the rated capacity of the sodium-sulfur battery caused by possible deterioration or the like of electric cells, thereby securing the rated capacity until the final year of the expected life thereof. In this case, however, since there is practically no residual capacity at the initial stage of delivering the sodium-sulfur battery (a new product), sometimes the state of charge should exceed the rated capacity at the end of the charge if the integrated charge currents are added to the state of charge at the initial stage of delivering the battery, which is designed by taking the increase of the residual capacity after the lapse of several years into consideration. Thus, it cannot be said that the accurate calculation of the state of charge is calculated. As corrective measures thereto, there may be thought about a method in which resetting is carried out by taking the state of charge at the end of a charge as 100%. However, when the battery is used in such an application for compensating for fluctuations in the power generated by a natural energy generating device among the aforesaid applications, it may take a long period of time until the end of a charge is reached. This may increase the error in the state of charge to a great extent.

The present invention has been made with a view of the background described above and it is an object of the invention to provide a means which is applicable to the compensation for fluctuations in power generated by a natural energy generating device and which permits accurate and precise calculation of the state of charge of a sodium-sulfur battery. Studies have revealed that the object can be fulfilled by the following means.

According to the present invention, there is provided a method for calculating the state of charge of a sodium-sulfur battery by determining, based on an expression (1) given below, a state of charge $Qr$ [Ah] of the sodium-sulfur battery which is constituted in such a manner that an s number of plural electric cells in series is connected to form a string, a b number of plural thus formed strings is connected in parallel to form a block, an n number of plural thus formed blocks is connected in series to form a module, and finally an m number of plural thus formed modules is connected in series:

$$Qr = 100 \times (1 - (Qu/(Qa - Qsf))) \qquad (1)$$

where
Qu: used capacity [Ah]
Qa: product capacity [Ah]
Qsf: residual capacity in final year [Ah]

$$Qsf = f1(Cef) \qquad (2)$$

where f1(Cef): conversion function for determining the residual capacity Qsf in the final year on the basis of the equivalent cycle Cef in the final year.

The method for calculating the state of charge of a sodium-sulfur battery according to the present invention is a method for calculating the current state of charge of a sodium-sulfur battery. The term "current" here means the point of time at which the calculation is about to start. The same meaning applies a current residual capacity Qsc of a block and the like, which will be described hereinafter. The state of charge is a dischargeable electrical quantity [Ah] remaining in the sodium-sulfur battery, and it is a management value. The method for calculating the state of charge of a sodium-sulfur battery according to the present invention may be said to be a means for matching the state of charge, which is a management value, to a true (actual) state of charge.

The product capacity is an electrical quantity [Ah] that a sodium-sulfur battery can absolutely have, and is also called an absolute charge. The product capacity is a designed value (fixed value). The residual capacity is an electrical quantity [Ah] that remains in the sodium-sulfur battery with age and cannot be discharged. An equivalent cycle determines the value of the residual capacity (refer to FIG. 7, which will be discussed hereinafter). The number of the equivalent cycles corresponds to the number of cycles of discharges at a rated capacity (Ah). A discharge carried out is always followed by a charge (for the next discharge), which explains why it is called a cycle. If the yearly numbers of discharges carried out at the rated capacity (Ah) are uniform, then the equivalent cycles can be replaced by the number of lapse years. The final year means the final year in an expected life.

The used capacity is an electrical quantity [Ah] (considered) to have been (actually) discharged by the sodium-sulfur battery, and this is a management value determined by calculation. The electrical quantity [Ah] that can be discharged by the sodium-sulfur battery is referred to as an available capacity. The rated capacity is a (specified) available capacity peculiar to each sodium-sulfur battery. The used capacity changes within the range of an available capacity. The used capacity is set again (reset) to 0 [Ah] at the end of a charge and determined by adding up currents from that point (e.g., "+" for a discharge current or "−" for a charge current).

However, in the method for calculating the state of charge of the sodium-sulfur battery according to the present invention, the used capacity for calculating the state of charge is desirably reset also at the end of a discharge as shown below. In this case, it is not of course reset to 0 [Ah].

More specifically, in the method for calculating the state of charge of a sodium-sulfur battery according to the present invention, preferably, the used capacity Qu [Ah] is reset to 0 [Ah] at the end of a charge and also reset according to expression (3) given below in a single-phase region after the completion of a discharge.

$$Qu = Qn - Qsc \quad (3)$$

where
Qn: normal block depth of charge [Ah]
Qsc: current block residual capacity [Ah]

$$Qn = b \times f2(Vi(t,T,Id)) \quad (4)$$

where f2(Vi(t, T, Id)): conversion function for determining the depth of charge of the block 33 based on the voltage of the block 33 of the modules of an i-th highest voltage after having comparing the blocks each showing the highest voltage in each of the modules (The voltage is to be obtained by converting into a stable open-circuit voltage [V] on the basis of an unstable open-circuit voltage measured after t time has passed since the completion of a discharge in a single-phase region and then correcting the converted stable open-circuit voltage on the basis of a temperature T upon completion of the discharge and a discharge current Id upon completion of the discharge.).

$$Qsc = f11(Cec) \quad (5)$$

where f11(Cec): conversion function for determining the current block residual capacity Qsc on the basis of the current equivalent cycle Cec.

The expression "to reset the used capacity to 0 [Ah] at the end of a charge" means to reset it to 0 [Ah] if the end of a charge is reached, but does not mean to reset it to 0 [Ah] by always bringing up the end of a charge.

The method for calculating the state of charge of a sodium-sulfur battery according to the present invention is preferably used in the case where the sodium-sulfur battery, the state of charge of which is to be calculated, is a sodium-sulfur battery which constitutes a power storage compensating unit in an interconnected system, which combines a power generating unit incurring output fluctuations and the power storage compensating unit to supply power to a power system, and which compensates for the output fluctuations of the power generating unit.

In the method for calculating the state of charge of a sodium-sulfur battery according to the present invention, whether or not a certain region is a single-phase region is determined by determining whether or not the region is a region in which a voltage drops in the relationship between a depth of charge and a voltage (which will be discussed in more detail hereinafter). Alternatively, a determination voltage may be set beforehand to determine whether or not a region is the single-phase region so as to determine that a certain region is a single-phase region if a voltage drops to the preset voltage or less. In this case, the value of the determination voltage may be set to be slightly lower (by a predetermined value) than a predetermined voltage in a two-phase region.

In the method for calculating the state of charge of a sodium-sulfur battery according to the present invention, temperature means a battery operating temperature or more specifically, the temperature in a module during an operation.

The voltages, currents, depths, capacities (electrical quantities) and the like in the present description are shown in terms of expressions or the like with the references thereof given; however, it is needless to say that there are cases where they can be mutually converted into the values or quantities of electric cells, blocks, modules, the whole sodium-sulfur battery (a plurality of modules) or the like, as necessary, and need to be transformed (converted).

The method for calculating the state of charge of a sodium-sulfur battery according to the present invention determines the state of charge of the sodium-sulfur battery according to the aforesaid expression (1). In this expression (1), (Qa−Qsf) corresponds to the available capacity in the final year. The available capacity always remains constant, however, in the final year, the electrical tolerance (which will be discussed later) is 0 (zero), so that the available capacity is determined by calculating Qa−Qsf. Then, in the method for calculating the state of charge of the sodium-sulfur battery according to the present invention, expression (1) determines the (current) state of charge on the basis of the ratio of the (current) used capacity to the available capacity, thus making it always possible to calculate an accurate state of charge independently of changes in the residual capacity with the lapse of year.

Moreover, a state of charge can be precisely calculated, thus protecting a sodium-sulfur battery from being operated beyond an operational range and also preventing the battery from being overdischarged or overcharged. This makes it possible to avoid a vicious circle in which an overdischarge or an overcharge results in further deterioration or the like of electric cells.

In a preferred embodiment of the method for calculating the state of charge of a sodium-sulfur battery according to the present invention, since a used capacity is reset at the end of a charge and in a single-phase region after a discharge (on the side of a discharge end), the used capacity is reset at regular intervals against an error which is incurred during the measurement of a charge current and a discharge current, and even expanded in integration. This arrangement prevents an increase in an error also in the state of charge determined on the basis of the used capacity, making it possible to calculate the state of charge more accurately than in the case where the method for calculating the state of charge of a sodium-sulfur battery according to the present invention is not used. Further, when used for compensating for fluctuations in the power generated by a natural energy generating device, a charge does not reach an end for an extended period of time. Even in such a case, it is not likely that an error in the state of charge will increase (since the used capacity is reset at the side of a discharge end).

In a preferred embodiment of the method for calculating the state of charge of a sodium-sulfur battery according to the present invention, a used capacity is reset according to expression (3) in a single-phase region after completion of a discharge (at the side of a discharge end), and the current used capacity is reset on the basis of the (current) depth of charge of a normal block determined from a block voltage and a current block residual capacity. Thus, the state of charge calculated according to expression (1) on the basis of the (current) used capacity will have a more accurate value as a-current state of charge, compared with the case where the preferred embodiment of the present inventive method for calculating the state of charge of the sodium-sulfur battery is not employed.

In a preferred embodiment of the method for calculating the state of charge of a sodium-sulfur battery according to the present invention, it is preferable to judge a drop in the capacity of a sodium-sulfur battery applied to compensate for the fluctuations in the power generated by a natural energy generating device since a used capacity of the sodium-sulfur battery is reset according to expression (3) in a single-phase region after completion of a discharge (at the side of a discharge end), and at this time, the depth of charge is determined on the basis of a voltage measured after the lapse of time t from completion of a discharge, as indicated by expression (4), thereby an extended period of rest for a voltage to completely become stable is not required.

DETAILED DESCRIPTION OF THE INVENTION

Figure 1:
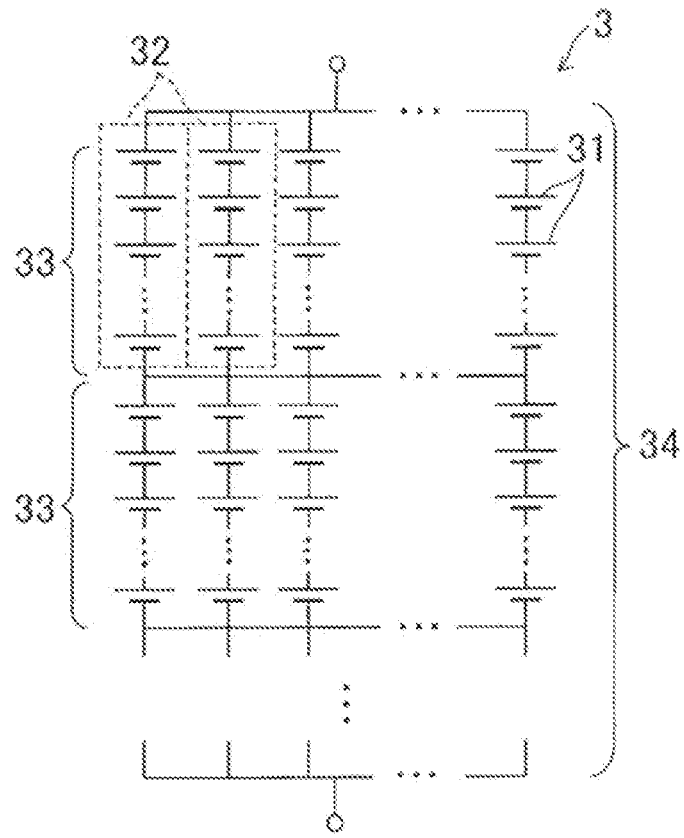
FIG. 1 is a circuit diagram illustrating an example of a module constituting a sodium-sulfur battery.

The following will describe embodiments of the present invention with reference to the accompanying drawings, as appropriate. However, the embodiments are not deemed to limit the interpretation of the present invention. Various changes, modifications, improvements, replacements may be added according to the knowledge of persons skilled in the art within the spirit and scope of the present invention. For example, although the accompanying drawings illustrate preferred embodiments of the present invention, the present invention is not limited by the embodiments illustrated in the drawings or information given in the drawings. To embody or verify the present invention, the same or equivalent means as or to the means described in the present description may be applied. However, a preferred means is the one described below.

Figure 2:
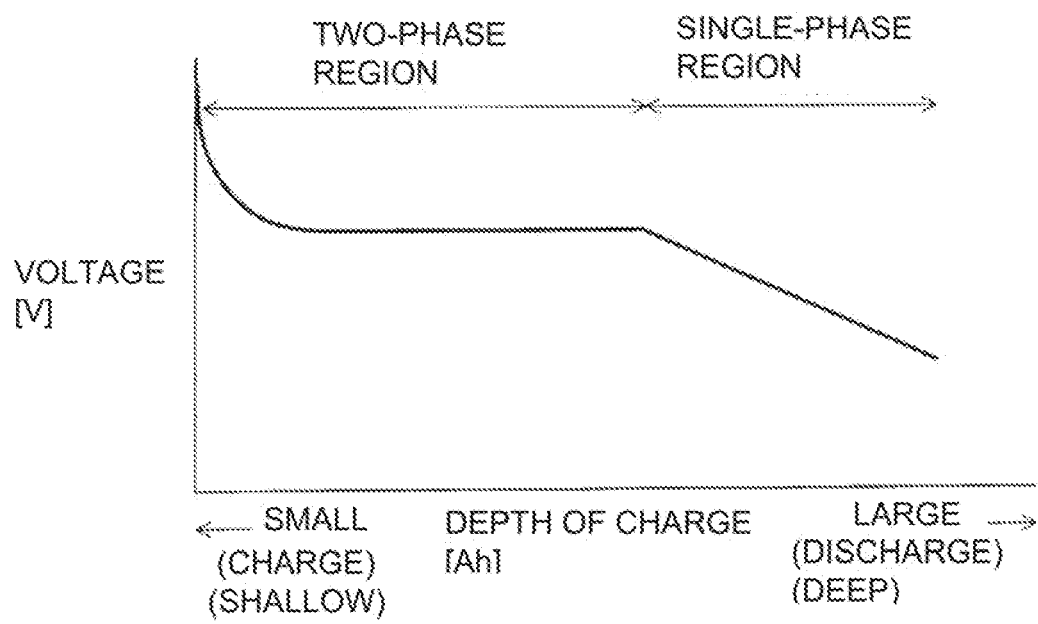
FIG. 2 is a graph illustrating the relationship between depth of charge and voltage of the sodium-sulfur battery.
Figure 3:
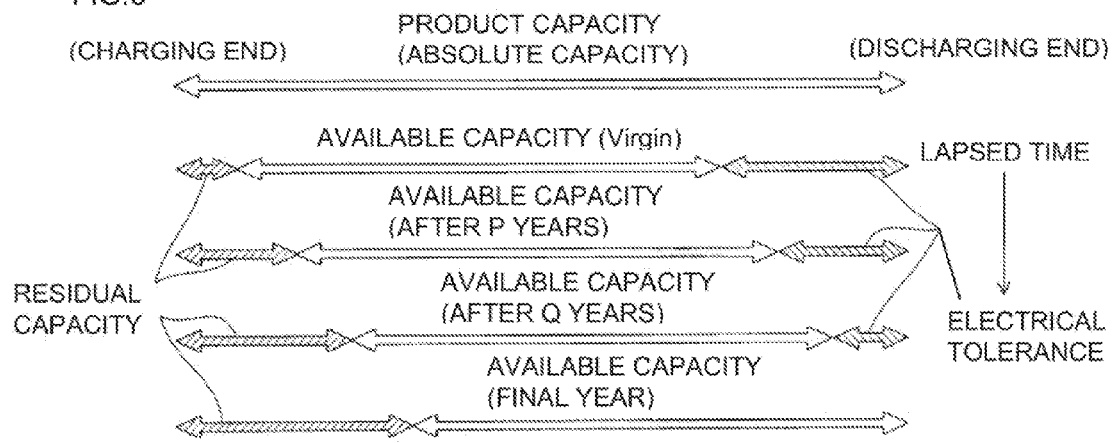
FIG. 3 is a conceptual diagram illustrating the age deterioration of the sodium-sulfur battery.

First, with reference to FIG. 1 to FIG. 3, the construction and applications of a sodium-sulfur battery will be exemplified and general principle and operation thereof will be explained. FIG. 1 is a circuit diagram illustrating an example of a module constituting the sodium-sulfur battery. FIG. 2 is a graph illustrating the relationship between depth of charge and voltage of the sodium-sulfur battery. FIG. 3 is a conceptual diagram illustrating the deterioration of the sodium-sulfur battery with lapse of time.

A sodium-sulfur battery 3 has a plurality of (an m number) modules 34 shown in FIG. 1. Each of the modules 34 is constructed of a plurality of (an n number of) blocks 33 connected in series, each of the blocks 33 is constructed of a plurality of (a b number of) strings 32 connected in parallel, and each of the strings 32 is constructed of a plurality of (an s number of) electric cells 31 connected in series.

The electric cell 31 has molten metal sodium, which is a cathode active material, and molten sulfur, which is an anode active material. The cathode active material and the anode active material are isolated by a beta alumina solid electrolyte, which has a selective permeability with respect to sodium ions. The sodium-sulfur battery is a high-temperature secondary battery operated at about 280° C. to about 350° C. (around 300° C.). At the time of a discharge, the molten sodium emits electrons and turns into a sodium ion, which moves to the anode side through a solid electrolyte tube so as to react with sulfur and electrons having passed through an external circuit to generate sodium polysulfide, thereby generating a voltage of approximately 2V in the electric cell 31. Reversely from a discharge, the reaction to produce sodium and sulfur takes place in a charge. The operating cycle of the sodium-sulfur battery consists of the repetition of a cycle of the aforesaid discharge and charge with a rest between the cycles when the battery is used in, for example, a load leveling application.

As illustrated in FIG. 2, the voltage (e.g., a block voltage) while the sodium-sulfur battery is in operation remains almost constant except for the vicinity of the end of a charge or a discharge. The voltage obviously rises toward the end of the charge and obviously falls toward the end of the discharge with a reduction in the molar proportion of sulfur. In the sodium-sulfur battery, the composition of the sodium polysulfide generated at the positive electrode changes according to a depth of charge. The changes in the composition are grasped in terms of the value of x of $Na_2S_x$. In a fully charged state, the positive electrode has a two-phase region wherein S and $Na_2S_5$ coexist. In the two-phase region, a certain electrochemical reaction continues and the voltage remains constant except in the vicinity of the end of the charge although the voltage rises as internal resistance increases (the region showing a flat relationship between the depth of charge and the voltage in FIG. 2). As the discharge proceeds, the discrete S runs out, causing the positive electrode to turn into a single-phase region of $Na_2S_x$ (x<5) (a region showing a descending relationship between the depth of charge and the voltage in FIG. 2). In the single-phase region, the molar proportion of sulfur reduces (x reduces) and the voltage drops substantially linearly as the discharge proceeds. When the discharge further proceeds, causing x to be 3 or less, a solid phase having a high melting point ($Na_2S_2$) is generated, preventing any further discharge.

As with many other secondary batteries, a sodium-sulfur battery in a virgin state cannot be fully charged 100% although the depth of charge (the depth of charge during an operation) is fixed, and the (aging) residual capacity that prevents a full charge increases as time passes, as illustrated in FIG. 3. For this reason, in designing a sodium-sulfur battery, an electrical tolerance is considered for an available capacity, so that the electrical tolerance compensates for an increase in the residual capacity thereby to secure the available capacity until the final year (expected life) is reached. In the present description, the electrical tolerance refers to the capacity obtained by subtracting the residual capacity and the available capacity from the product capacity.

The method for calculating the state of charge of a sodium-sulfur battery according to the present invention will now be described by taking, as an example, the case of the sodium-sulfur battery 3 illustrated in FIG. 1. The number (the series number) of the modules 34 of the sodium-sulfur battery 3 is ten, the number (the series number) of the blocks 33 constituting the module 34 is four, the number (the parallel number) of the strings 32 constituting the block 33 is twelve, and the number (the series number) of the electric cells 31 constituting the string 32 is eight.

According to the method for calculating the state of charge of the sodium-sulfur battery according to the present invention, a state of charge Qr [Ah] of the sodium-sulfur battery is determined according to expression (1) given below:

$$Qr=100\times(1-(Qu/(Qa-Qsf)))  \quad (1)$$

where
Qu: used capacity [Ah]
Qa: product capacity [Ah]
Qsf: residual capacity in final year [Ah]

$$Qsf=f1(Cef) \quad (2)$$

where f1(Cef): conversion function for determining the residual capacity Qsf in the final year on the basis of the equivalent cycle Cef in the final year The product capacity Qa denotes a designed value, and the used capacity Qu denotes a value determined by integrating the currents related to charges and discharges (e.g., discharge currents are indicated by "+" and charge currents are indicated by "−") of the sodium-sulfur battery.

Figure 7:
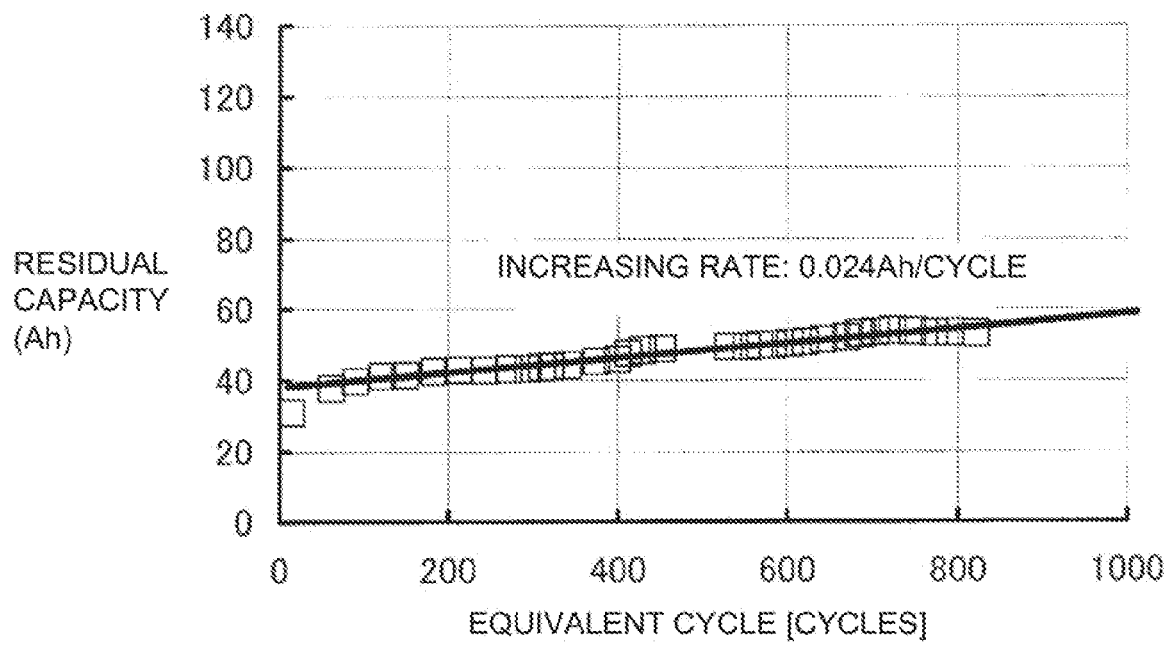
FIG. 7 is a graph illustrating the relationship between residual capacity [Ah] and equivalent cycle (cycle).

FIG. 7 is a graph, which illustrates the relationship between residual capacity [Ah] and equivalent cycle (the number of cycles) [cycle] and which shows that the residual capacity increases as discharges are repeated (with lapse of time). According to FIG. 7, if the equivalent cycle in the final year (Cef) is set, the residual capacity in the final year (Qsf) may be obtained. Moreover, in FIG. 7, the residual capacity means a residual capacity of an electric cell.

The used capacity Qu in expression (1) is reset to 0 [Ah] at the end of a charge. The end of a charge can be generally judged by checking whether or not the voltage of a block 33 has reached a charge end cut voltage VH shown by expression (6) given below during a charge. The value 2.075 in expression (6) denotes an open voltage [V] of an electric cell 31 at the end of a charge, and the value 8 denotes the number (=s) of the electric cells 31.

$$VH=8\times(2.075+\alpha)+I\times R \quad (6)$$

where
α: polarization voltage [V]
I: charge current [A]
R: internal resistance of battery (resistance of block) [Ω]

However, in the judgment of end of a charge, it is preferable to take the auxiliary charge described in JP 3505116 into consideration. For example, when the final auxiliary charge stage described in JP 3505116 is reached, it may be judged as the end of a charge.

The used capacity Qu in expression (1) is reset according to expression (3) given below in a single-phase region after completion of a discharge.

$$Qu=Qn-Qsc \quad (3)$$

where
Qn: depth of charge of normal block [Ah]
Qsc: current block residual capacity [Ah]

Further, the depth of charge Qn [Ah] of a normal block in expression (3) is set according to expression (4') given below. In expression (4'), 12 denotes the number (b) of strings 32 constituting a block 33.

$$Qn=12\times f2(V5(0,5,T,Id)) \quad (4')$$

where f2(V5(0.5, T, Id)): conversion function for determining the depth of charge [Ah] of the block 33 based on the voltage [V] of the block 33 of the module 34 of, for example, a fifth highest voltage after having comparing blocks each showing the highest voltage in each of the modules (The voltage [V] is to be obtained by converting into a stable open-circuit voltage [V] based on an unstable open-circuit voltage [V] measured after 30 minutes (0.5 hours) have passed since the completion of a discharge in the single-phase region and then correcting the converted stable open-circuit voltage [V] on the basis of a temperature T[° C.] upon completion of the discharge and a discharge current Id[A] upon completion of the discharge.)

Since the voltage of the sodium-sulfur battery 3 stabilizes in two to four hours after completion of a discharge, the depth of charge can be easily calculated by measuring the open-circuit voltage, using a voltage measuring apparatus at the end of the (true) discharge at the point of time in a block. However, it is difficult to hold the battery at rest for such a long time, especially when used for compensating for fluctuations in the power generated by a natural energy generating device. Hence, the method for calculating the state of charge of the sodium-sulfur battery according to the present invention uses a means for determining the (true, stabilized) open-circuit voltage at the end of a discharge on the basis of the transient voltage indicated by the sodium-sulfur battery after the completion of the discharge.

To be more specific, for the measurement of the voltage of the block 33 in the module 34, the open-circuit voltage [V] of the block 33 is measured, for example, using a voltage measuring apparatus after 30 minutes (=t time) passes since the completion of a discharge in a single-phase region (refer to FIG. 2). The open-circuit voltage at this time is referred to as the 30-minute rest OCV (Open Circuit Voltage). Then, the 30-minute rest OCV is converted into the open-circuit voltage [V] of the block 33 after the lapse of for example, two hours. This open-circuit voltage is referred to as the two-hour rest OCV and considered to be the true open-circuit voltage value (before the correction based on the temperature and the discharge current).

Figure 4:
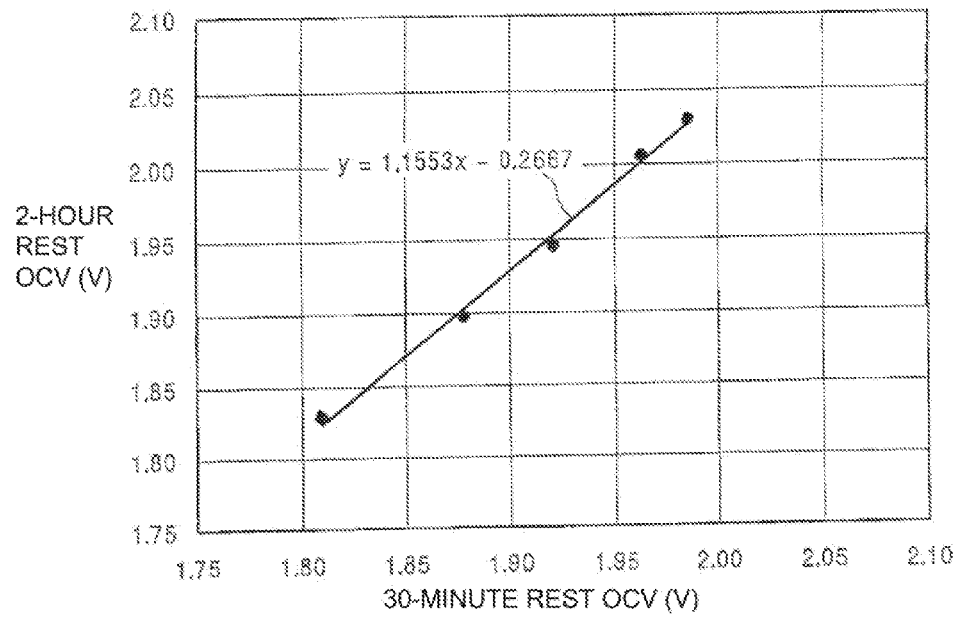
FIG. 4 is a graph illustrating the relationship between 30-minute rest OCV and 2-hour rest OCV after completion of a discharge in a single-phase region.

The conversion can be accomplished on the basis of the relationship illustrated in FIG. 4. In the expression (y=1.1553x−0.2667) shown in FIG. 4, x denotes the 30-minute rest OCV, and y denotes the two-hour rest OCV (the true open-circuit voltage before correction). In FIG. 4, each OCV is indicated as the OCV of an electric cell, as is clear from the numerical values on the axis of ordinates and the axis of abscissas.

Figure 5:
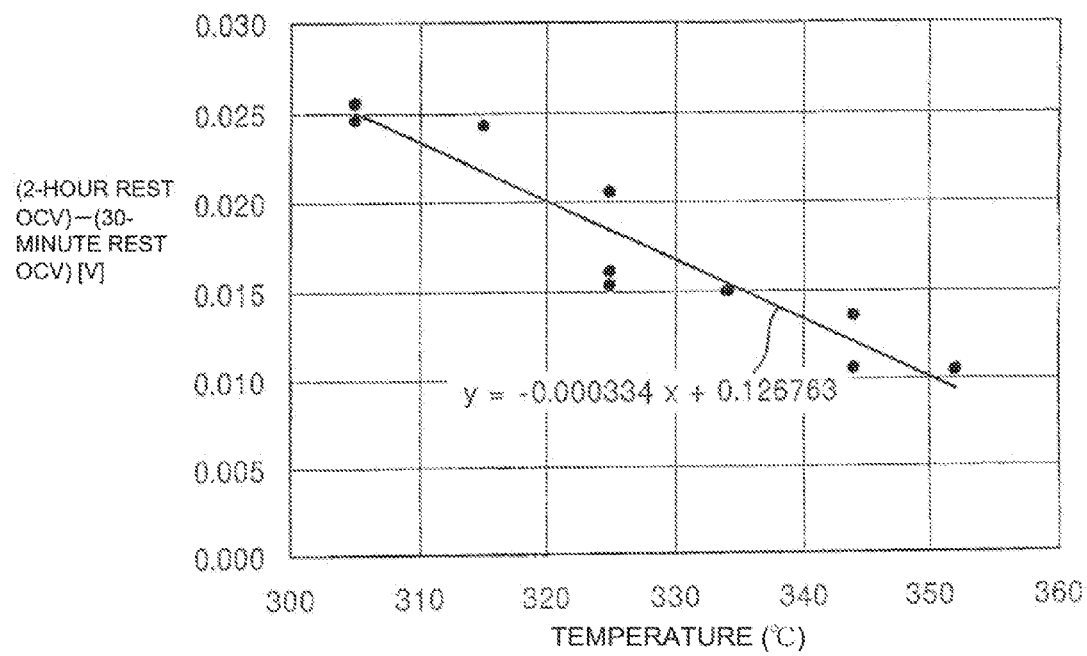
FIG. 5 is a graph illustrating the relationship between the temperature upon completion of a discharge and the value of (the 2-hour rest OCV−the 30-minute rest OCV) after completion of the discharge in the single-phase region.
Figure 6:
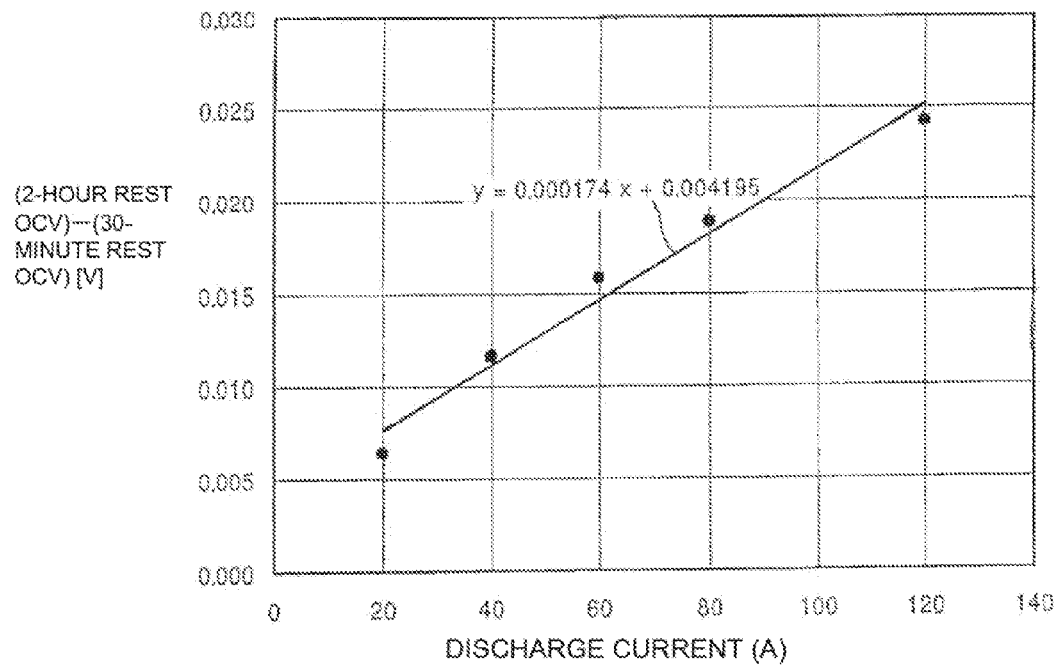
FIG. 6 is a graph illustrating the relationship between the discharge current upon completion of the discharge and the value of (the 2-hour rest OCV−30-minute rest OCV) after completion of the discharge in the single-phase region.

A further correction is made on the basis of the temperature T [° C.] and the discharge current Id [A] upon the completion of the discharge to determine the true open-circuit voltage value of the block. As illustrated in FIG. 5 and FIG. 6, the correction can be made on the basis of the point that the value of (the two-hour rest OCV–the 30-minute rest OCV)[V] and the temperature T [° C.] and the discharge current [A] have a predetermined relationship. The value of (the two-hour rest OCV–the 30-minute rest OCV)[V] is a correction value (a value to be corrected), and the value to be corrected is the two-hour rest OCV (before correction) [V] determined on the basis of the 30-minute rest OCV.

In the expression (y=−0.000334 x+0.126763) shown in FIG. 5, x denotes temperature and y denotes (the two-hour rest. OCV–the 30-minute rest OCV). According to FIG. 5, if the temperature rises by, for example, 10° C., then a correction of approximately −0.004V (−4 mV) is required.

In the expression (y=0.000174 x+0.004195) shown in FIG. 6, x denotes discharge current and y denotes (the two-hour rest OCV–the 30 minute rest OCV). According to FIG. 6, if the discharge current increases by, for example, 10 A, then a correction of approximately +0.003V (3 mV) is required.

For each module 34, the voltages of the blocks 33 constituting the module 34 are determined to identify the block 33 having a highest voltage [V]. Then, based on the (highest) voltage of the block 33 determined in each of the modules 34, the comparison among the modules 34 is carried out to determine the voltage of the block 33 in the module 34 having (for example) a fifth highest voltage.

Subsequently, the determined voltage [V] is converted into the depth of charge [Ah]. The voltage is based on a voltage measured in the single-phase region, so that the voltage [V] can be Converted into the depth of charge [Ah] (refer to FIG. 2). The depth of charge (capacity) is based on the voltage of the block 33 and therefore equivalent to the capacity of a single string 32. Thus, multiplying the depth of charge by twelve, which is the number of the strings 32, determines the depth of charge [Ah] of the block, which is a normal block depth of charge Qn [Ah].

The current residual capacity Qsc in expression (3) is determined according to expression (5) given below:

$$Qsc = f11(Cec) \quad (5)$$

where f11(Cec): conversion function for determining a current block residual capacity Qsc on the basis of a current equivalent cycle Cec.

In FIG. 7 described above, if the current equivalent cycle (Cec) is set, the current block residual capacity (Qsc) may be determined. As described above, the residual capacity in FIG. 7 is the residual capacity of an electric cell.

INDUSTRIAL APPLICABILITY

The method for calculating the state of charge of a sodium-sulfur battery according to the present invention may be preferable used as a means for accurately and precisely calculating the current state of charge of a sodium-sulfur battery used for applications, such as load leveling, measures against a momentary drop in power, or compensation for fluctuations in the power generated by a natural energy generating system.

DESCRIPTION OF REFERENCE NUMERALS

3: sodium-sulfur battery; 31: electric cell; 32: string; 33: block; and 34: module.

The invention claimed is:

1. A method for calculating the state of charge of a sodium-sulfur battery constituted by connecting an s number of plural electric cells in series to form a string, connecting a b number of plural strings in parallel to form a block, connecting an n number of plural blocks in series to form a module, and then connecting an m number of plural modules in series, the method comprising steps of:
   measuring, by a voltage measuring apparatus, an open-circuit voltage of each of the n blocks in each of them modules at a time t following completion of discharge of the sodium-sulfur battery;
   determining used capacity Qu [Ah] by using open-circuit voltage;
   determining residual capacity in final year Qsf [Ah] according to expression (1) by using a conversion function f1 on the basis of an equivalent cycle Cef in the final year $$Qsf = f1(Cef) \quad (1); \text{ and}$$

calculating the state of charge Qr according to expression (2) by using a product capacity Qa [Ah], the determined Qu and Qsf $$Qr = 100 \times (1 - (Qu/(Qa - Qsf))) \quad (2).$$

2. The method for calculating the state of charge of a sodium-sulfur battery according to claim 1, in the step of determining the used capacity Qu [Ah], the used capacity Qu is reset to 0 [Ah] at the end of a charge and also reset according to expression (3) given below in a single-phase region after completion of a discharge;

$$Qu = Qn - Qsc \quad (3)$$

where
   Qn indicates normal block depth of charge, and
   Qsc indicates current block residual capacity $$Qn = b \times f2(Vi(t, T, Id)) \quad (4)$$

where f2(Vi(t, T, Id)) indicates conversion function for determining a depth of charge of a block based on a voltage of a block of modules of an i-th highest voltage after having compared blocks each showing the highest voltage in each of modules (the voltage is to be obtained by converting into a stable open-circuit voltage on the basis of an unstable open-circuit voltage measured after t time has passed since completion of a discharge in a single-phase region and then correcting the converted stable open-circuit voltage on the basis of a temperature T upon completion of the discharge and a discharge current Id upon completion of the discharge):

$$Qsc = f11(Cec) \quad (5)$$

where f11(Cec) indicates conversion function for determining a current block residual capacity Qsc on the basis of a current equivalent cycle Cec.

3. The method for calculating the state of charge of a sodium-sulfur battery according to claim 1, wherein the sodium-sulfur battery, the state of charge of which is to be calculated is a sodium-sulfur battery which constitutes a power storage compensating unit in an interconnected system, which combines a power generating unit incurring output fluctuations and the power storage compensating unit to supply power to a power system, and which compensates for output fluctuations of the power generating unit.

4. The method for calculating the state of charge of a sodium-sulfur battery according to claim 2, wherein the sodium-sulfur battery, the state of charge of which is to be calculated is a sodium-sulfur battery which constitutes a power storage compensating unit in an interconnected system, which combines a power generating unit incurring output fluctuations and the power storage compensating unit to supply power to a power system, and which compensates for output fluctuations of the power generating unit.

* * * * *